United States Patent [19]
Gardner et al.

[11] Patent Number: 6,162,692
[45] Date of Patent: Dec. 19, 2000

[54] INTEGRATION OF A DIFFUSION BARRIER LAYER AND A COUNTER DOPANT REGION TO MAINTAIN THE DOPANT LEVEL WITHIN THE JUNCTIONS OF A TRANSISTOR

[75] Inventors: Mark I. Gardner, Cedar Creek; Derrick J. Wristers; Thien T. Nguyen, both of Austin, all of Tex.

[73] Assignee: Advanced Micro Devices, Inc., Sunnyvale, Calif.

[21] Appl. No.: 09/105,721

[22] Filed: Jun. 26, 1998

[51] Int. Cl.[7] .......................... H01L 21/336; H01L 21/425
[52] U.S. Cl. ........................... 438/301; 438/302; 438/527
[58] Field of Search .................................. 438/302, 527, 438/919, 301, 286, 199

[56] References Cited

U.S. PATENT DOCUMENTS

| | | | |
|---|---|---|---|
| 4,968,639 | 11/1990 | Bergonzoni . | |
| 5,362,981 | 11/1994 | Sato et al. . | |
| 5,409,848 | 4/1995 | Han et al. | 437/35 |
| 5,514,902 | 5/1996 | Kawasaki et al. | 257/607 |
| 5,516,707 | 5/1996 | Loh et al. | 437/24 |
| 5,518,942 | 5/1996 | Shrivastava | 437/43 |
| 5,554,544 | 9/1996 | Hsu | 437/35 |
| 5,554,871 | 9/1996 | Yamashita et al. | 257/336 |
| 5,750,435 | 5/1998 | Pan | 438/525 |
| 5,756,383 | 5/1998 | Gardner | 438/231 |
| 5,763,311 | 6/1998 | Gardner et al. | 438/286 |
| 5,770,490 | 6/1998 | Frenette et al. | 438/199 |
| 5,804,496 | 9/1998 | Duane | 438/520 |
| 5,834,347 | 11/1998 | Fukatsu et al. | 438/232 |
| 5,882,974 | 3/1999 | Gardner et al. . | |

Primary Examiner—John F. Niebling
Assistant Examiner—Walter L. Lindsay, Jr.
Attorney, Agent, or Firm—Kevin L. Daffer; Conley, Rose & Tayon

[57] ABSTRACT

An integrated circuit fabrication process is provided for placing a diffusion barrier layer above the junctions of a transistor and counter dopant regions at the boundaries of the junctions to enhance the dopant level within the junctions. The diffusion barrier layer (e.g., a nitride layer) is strategically placed between the junctions and sidewall spacers which extend laterally from the opposed sidewall surfaces of a gate conductor. The diffusion barrier layer inhibits the dopants within the junctions from passing into the sidewall spacers. Dopant species opposite in type to those in the junctions are implanted into the counter dopant regions using a "large tilt angle" (LTA) implant methodology, wherein the angle of incidence of the injected dopant ions is at a non-perpendicular angle relative to the upper surface of the semiconductor substrate. In this manner, the counter dopant regions are placed both beneath the junctions and at the juncture between the junctions and the channel region of the transistor. The counter dopants fill vacancy and interstitial sites within the substrate, and thus block migration avenues through which the dopants in the junctions could otherwise pass into other areas of the substrate. The integration of the diffusion barrier layer with the counter dopant regions ensures that the dopant concentration within the junctions will be maintained.

10 Claims, 4 Drawing Sheets

INTEGRATION OF A DIFFUSION BARRIER LAYER AND A COUNTER DOPANT REGION TO MAINTAIN THE DOPANT LEVEL WITHIN THE JUNCTIONS OF A TRANSISTOR

BACKGROUND OF THE INVENTION

1. Field of the Invention

This invention relates to integrated circuit fabrication and, more particularly, to placing a diffusion barrier layer above a transistor junction and a counter dopant region at the boundary of the transistor junction to enhance the dopant level within the junction.

2. Description of the Related Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source and drain regions (i.e., junctions) adjacent to and on opposite sides of the gate conductor. The gate conductor and the source and drain junctions are then implanted with an impurity dopant. If the dopant species employed for forming the source and drain junctions is n-type, then an NMOSFET ("n-channel") transistor device is formed. Conversely, if the dopant species is p-type, then a PMOSFET ("p-channel") transistor device is formed. Integrated circuits utilize either n-channel devices exclusively, p-channel devices exclusively, or a combination of both on a single monolithic substrate.

Transistor device dimensions have been continuously reduced to accommodate the high demand for faster, more complex integrated circuits. Unfortunately, along with this decrease in device dimensions, the lateral electric field generated in MOSFET devices has increased, giving rise to so-called hot carrier effects ("HCE"). HCE is a phenomena by which the kinetic energy of the charged carriers (holes or electrons) is increased as they are accelerated through large potential gradients, causing the charged carriers to become injected into and trapped within the gate oxide. The greatest potential gradient, often referred to as the maximum electric field, Em, occurs near the drain during saturated operation. As a result of carrier entrapment within the gate oxide, a net negative charge density forms in the gate oxide. The trapped charge can accumulate with time, resulting in a positive threshold shift in an NMOS transistor, or a negative threshold shift in a PMOS transistor.

To overcome problems of sub-threshold current and threshold shift resulting from HCE, an alternative drain structure known as the lightly doped drain ("LDD") is commonly used. The purpose of the LDD is to absorb some of the potential into the drain and thus reduce Em. A conventional LDD structure is one in which a light concentration of dopant is self-aligned to the gate conductor followed by a heavier dopant self-aligned to the gate conductor on which a pair of sidewall spacers have been formed. The purpose of the first implant dose is to produce a lightly doped section within the junctions at the gate edge near the channel. The second implant dose is spaced from the channel a distance dictated by the thickness of the sidewall spacers. The second implant dose forms heavily doped source and drain regions within the junctions laterally outside the LDD areas. In this manner, the lateral thickness of the sidewall spacers dictates the length of the LDD areas.

Although shrinking device dimensions advantageously affords increased circuit density and speed, it can also lead to various problems. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length ("Leff"). Decreasing the Leff of a transistor generally leads to so-called short-channel effects ("SCE"). PMOS transistors are particularly susceptible to SCE since their junctions are commonly doped with fast-diffusing boron. Boron, because of its small atomic mass, can diffuse across vacancy and interstitial sites within the crystal lattice of the substrate. In addition to migrating laterally, the boron atoms may penetrate deeper into the substrate, undesirably increasing the depth of the junctions.

Generally speaking, SCE impacts device operation by, inter alia, reducing device threshold voltages and increasing sub-threshold currents. As Leff becomes quite small, the depletion regions associated with the source and drain junctions may extend toward one another and substantially occupy the channel area. Hence, some of the channel will be partially depleted without any influence of gate voltage. As a result, less gate charge is required to invert the channel of a transistor having a short Leff. Somewhat related to threshold voltage lowering (i.e., rolloff) is the concept of sub-threshold current flow. Even at times when the gate voltage is below the threshold amount, current between the source and drain nonetheless exist for transistors having a relatively short Leff.

Two of the primary causes of increased subthreshold current flow, $I_{Dst}$, are punch through and drain-induced barrier lowering (DIBL). Punch through results from the widening of the drain depletion region when a reverse-biased voltage is placed on the drain. The electric field of the drain may eventually penetrate to the source area, thereby reducing the potential energy barrier of the source-to-body junction. The increased current flowing from source to body as a result of this occurrence may be undesirably collected by the drain. Recent studies have indicated that in devices which use ion implantation to adjust threshold voltages, the barrier is lowest away from the substrate surface. As a result, punch through current appears to flow deep within the substrate bulk material. Contrary to punchthrough current, DIBL-induced current seems to occur mostly at the substrate surface. Application of a drain voltage can cause the surface potential to be lowered, resulting in a lowered potential energy barrier at the surface. The subthreshold current at the substrate surface due to DIBL thus becomes larger as the gate voltage approaches the threshold voltage.

Another shortcoming related to the migration of dopant species is that the lower the dopant concentration, the higher the resistivity of the source and drain junctions. Unfortunately, the drive current capability of a transistor is reduced as the resistivity of the junctions increases. The dopant concentration within both the LDD areas and the source and drain regions may drop as a result of the out-diffusion of dopant species. While a substantial portion of the dopant species migrate into other areas of the substrate, some also migrate into the overlying sidewall spacers. The sidewalls spacers are typically composed of chemically-vapor deposited silicon dioxide ($SiO_2$). Silicon dioxide ("oxide") deposited using chemical-vapor deposition ("CVD") is typically not stoichiometric and contains oxygen vacancies. For example, CVD deposited oxide may contain molecules having one oxygen atom instead of two oxygen atoms. Absent the appropriate number of oxygen atoms, the sidewall spacers include dangling bonds that might entrap dopant species. The presence of oxygen vacancies also provides diffusion pathways through which the dopant species might migrate. Further, the Si-O bonds within the oxide are relatively weak and unstable. Accordingly, fast-diffusing species, e.g., boron, residing in the LDD areas proximate the substrate surface tend to pass into and become incorporated within the overlying sidewall spacers during subsequent anneal steps. In this manner, the substrate surface concentration of the dopant species may be significantly reduced.

It would therefore be of benefit to minimize the migration of dopant species positioned within the source and drain junctions. That is, the dopant species must be inhibited from diffusing into other areas of the substrate and into overlying sidewall spacers. Retaining the original dopant concentration within the junctions is necessary to prevent an increase in the resistivity of the junctions. Otherwise, if the resistivity of the junctions are allowed to rise, the saturation drive current of the transistor might drop. Further, the Leff of the transistor and the junction depth must be maintained in order to avoid detrimental short channel effects, such as increased subthreshold currents.

SUMMARY OF THE INVENTION

The problems outlined above are in large part solved by the technique hereof for placing a diffusion barrier layer above the junctions of a transistor and counter dopant regions at the boundaries of the junctions to enhance the dopant level within the junctions. The diffusion barrier layer is strategically placed between the junctions and sidewall spacers which extend laterally from the opposed sidewall surfaces of a gate conductor. Dopant species opposite in type to those in the junctions are implanted into the counter dopant regions using a "large tilt angle" (LTA) implant methodology, wherein the angle of incidence of the injected dopant ions is at a non-perpendicular angle relative to the upper surface of the semiconductor substrate. In this manner, the counter dopant regions are placed both beneath the junctions and at the juncture between the junctions and the channel region of the transistor.

The presence of the diffusion barrier layer substantially inhibits dopant species within the junctions from passing to overlying structures within the integrated circuit. In particular, the diffusion barrier layer helps prevent the dopant species from passing into sidewall spacers comprising, e.g., oxide. The diffusion barrier layer is composed of a material, preferably silicon nitride ($Si_3N_4$), which includes relatively strong atomic bonds (e.g., Si—N bonds). It is therefore believed that the bonds of the barrier layer are unlikely to break apart to bond with the dopant species. As such, the dopant species do not pass through the diffusion barrier layer, and thus do not approach the sidewall spacers. Consequently, the concentration of the dopant species within the junctions, particularly near the substrate surface, is maintained at its original amount, despite the presence of dangling bonds within, and migration avenues into, the spacers.

The impurities residing within the counter dopant regions advantageously fill vacancy and interstitial positions therein. As such, those impurities serve to block the diffusion pathways leading out of the junctions. Preferably, the dopant species residing within the counter dopant regions have a larger atomic mass than those species residing within the source and drain junctions. For example, a PMOSFET transistor may be formed which includes source and drain junctions implanted with B atoms. Counter dopant regions comprising species, e.g., As or P atoms, having a higher atomic mass than the B atoms may be formed beneath and adjacent the lateral boundaries of the junctions. The counter dopant species serve to "stuff" the migration avenues through which the B atoms could pass into other areas of the substrate. Although the B atoms are relatively small in size, the counter dopant species are sufficiently large to completely fill the voids through which the B atoms could otherwise pass. The counter dopant regions thus serve to substantially inhibit the depth of the junctions and the Leff of the transistor from being increased. Therefore, the counter dopant regions help minimize SCE and subthreshold currents. Together, the counter dopant regions and the diffusion barrier layer substantially confine the dopant species within the junctions, and thus prevent the resistivity of the junctions from increasing. Absent out-diffusion of the dopant species from the junctions, the drive current of the ensuing transistor is advantageously increased.

According to an embodiment, a method for forming an integrated circuit is provided. A gate conductor is first patterned upon a gate dielectric, wherein the gate dielectric is arranged across a semiconductor topography comprising, e.g., single crystalline silicon. The gate conductor is laterally bound by a pair of opposed sidewall surfaces. An LDD implant is self-aligned to the opposed sidewall surfaces of the gate conductor to form source-side and drain-side LDD areas within the substrate. The LDD implant may be performed using a first type of dopant species, e.g., a p-type species such as boron. Subsequently, a masking layer may be formed upon the drain-side LDD area. An LTA implant of dopant species opposite in type to that in the LDD areas may then be performed at a 20° to 60° angle relative to the substrate surface. The LTA implant is directed toward the gate conductor. As a result of the LTA implant, a source-side counter dopant region is formed beneath the source-side LDD area. The resulting source-side counter dopant region also resides adjacent a lateral boundary of the source-side LDD area, a spaced distance below the substrate surface. A drain-side counter dopant region may be formed in a similar manner. Leaving a gap between the substrate surface and the counter dopant regions reduces the threshold voltage of the ensuing transistor.

Thereafter, the gate dielectric is removed from the LDD areas and a diffusion barrier layer comprising, e.g., silicon nitride ("nitride") is deposited across the topography. Alternatively, a relatively thin layer of oxide may be formed across the topography before the nitride is deposited. Subsequently, sidewall spacers comprising, e.g., oxide, may be formed upon lateral sidewalls of the nitride layer. A source/drain implant is then self-aligned to the outer lateral edges of the sidewall spacers. Source and drain regions are thusly placed within the substrate a lateral spaced distance from the gate conductor. The lower boundaries of the source and drain regions are preferably spaced above that of the counter dopant region. A post-implant anneal may then be performed to activate and position the dopant species within the LDD areas and the source and drain regions. During the anneal step, the diffusion barrier layer and the counter dopant regions substantially inhibit the dopant species from migrating out of the junctions. Maintaining the as-implanted dopant level within the LDD areas ensures that resistance to the flow of current between the source and drain regions is not too high.

BRIEF DESCRIPTION OF THE DRAWINGS

Other objects and advantages of the invention will become apparent upon reading the following detailed description and upon reference to the accompanying drawings in which.

Figure 1:
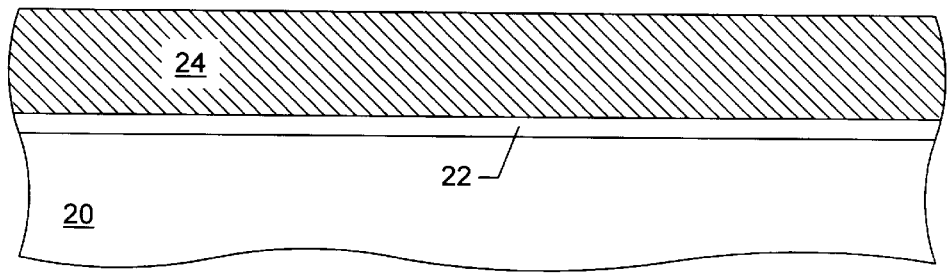
FIG. 1 depicts a side plan view of a semiconductor topography in which a gate conductor is spaced above a semiconductor substrate by a gate dielectric.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 2:
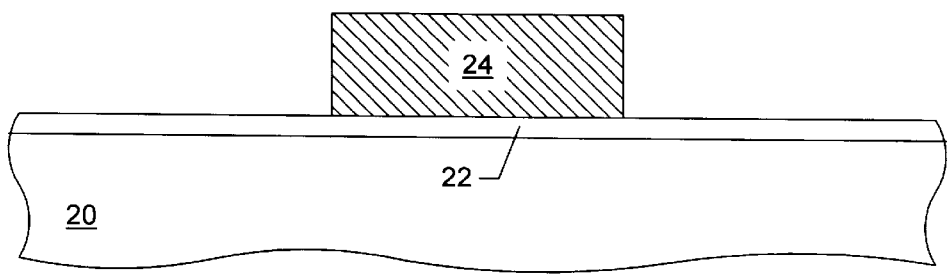
FIG. 2 depicts a partial cross-sectional view of the semiconductor topography, wherein portions of the gate conductor are etched from the gate dielectric to define a pair of opposed sidewall surfaces which bound the gate conductor, subsequent to the step in FIG. 1.

Turning now to the drawings, FIG. 1 depicts a semiconductor substrate 20 upon which a gate dielectric 22 and a gate conductor 24 have been formed. Substrate 20 comprises single crystalline silicon which has been slightly doped with n-type or p-type impurities. Isolation structures, such as shallow trench or LOCOS structure, may be arranged spaced distances apart within substrate 20 to isolate ensuing active areas. Gate dielectric 22 may comprise, e.g., nitride or oxide which has been deposited across substrate 20 using chemical-vapor deposition ("CVD"). Gate conductor 24 preferably comprises polysilicon which has been CVD deposited from, e.g., a silane source. The polysilicon may be subsequently rendered conductive by the implantation of impurities therein. Gate conductor 24 may alternatively comprise other conductors, such as aluminum and tungsten. As shown in FIG. 2, select portions of gate conductor 24 may be removed using well-known lithography and etch techniques. Preferably, a plasma etch is used to remove those portions of gate conductor 24. The plasma etch duration is selected to terminate before substantial portions of gate dielectric 22 are removed. As a result of the etch, substantially vertical sidewall surfaces are defined at the lateral boundaries of gate conductor 24.

Figure 3:
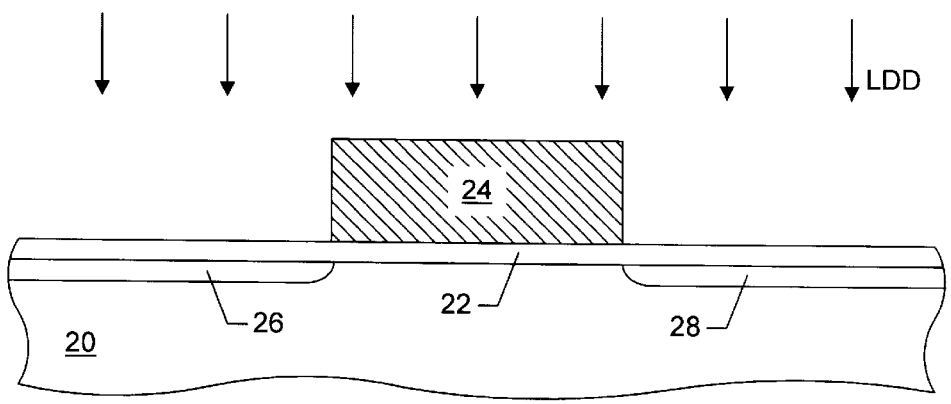
FIG. 3 depicts a partial cross-sectional view of the semiconductor topography, wherein an LDD implant is self-aligned to the opposed sidewall surfaces of the gate conductor to form LDD areas within the substrate, subsequent to the step in FIG. 2.
Figure 4:
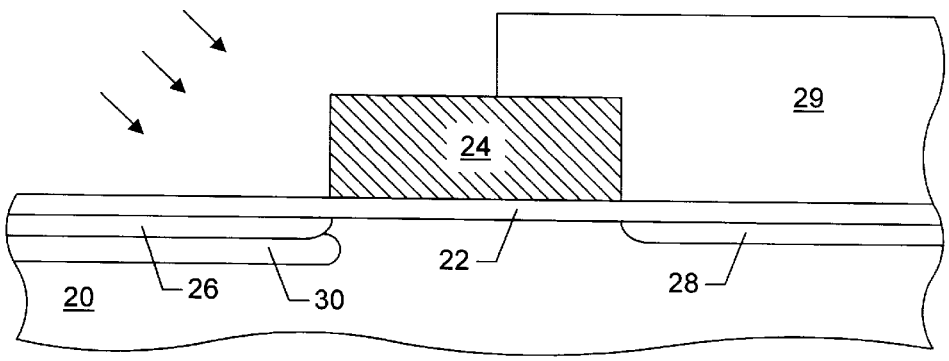
FIG. 4 depicts a partial cross-sectional view of the semiconductor topography, wherein a first LTA implant which is non-perpendicular to the substrate surface is performed to form a counter dopant region at the boundary of the source-side LDD area, subsequent to the step in FIG. 3.

FIG. 3 illustrates the formation of source-side LDD area 26 and drain-side LDD area 28. LDD areas 26 and 28 are formed by self-aligning an LDD implant to the opposed sidewall surfaces of gate conductor 24. The angle of incidence of the LDD implant is 0° (i.e., perpendicular) relative to the substrate surface. In a preferred embodiment, p-type dopant species, e.g., B, $BF_2$, or $B_2F_{12}$ are used for the LDD implant. As shown in FIG. 4, an LTA implant which is at an incidence angle of approximately 20° to 60° relative to the substrate surface is implanted into substrate 20 to form source-side counter dopant region 30. Prior to the LTA implant, a masking layer comprising, e.g., photoresist patterned using lithography, is formed upon drain-side LDD area 28. Dopant species which are opposite in type to those previously implanted during the LDD implant are used for the LTA implant. In the case that LDD areas 26 and 28 contain p-type species, n-type species, e.g., As and P, are employed for the LTA implant. Since As and P have larger atomic masses than B, they serve as good barriers to the migration of B. The angle of the implant is sufficient to allow dopant species to be incorporated at the edge of the channel, adjacent the lateral boundary of source-side LDD area 26. The dose of the implant is sufficient to position dopant species beneath source-side LDD area 26. Preferably, the upper boundary of counter dopant region 30 is displaced a spaced distance below the upper surface of substrate 20.

Figure 5:
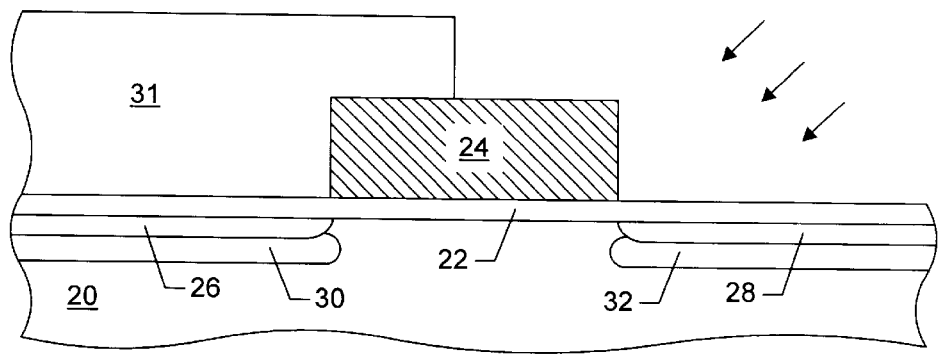
FIG. 5 depicts a partial cross-sectional view of the semiconductor topography, wherein a second LTA implant which is non-perpendicular to the substrate surface is performed to form a counter dopant region at the boundary of the source-side LDD area, subsequent to the step in FIG. 4.

Turning to FIG. 5, masking layer 29 is stripped from drain-side LDD area 28 and another masking layer 31 is formed upon source-side LDD area 26. A second LTA implant is performed in the same manner as the previous LTA implant except that it is directed toward the right side of gate conductor 24 instead of the left side. As a result of the second LTA implant, a drain-side counter dopant region 32 is formed beneath drain-side LDD area 28. Counter dopant region 32 is also placed at the edge of the channel region adjacent the lateral edge of drain-side LDD area 28. Counter dopant region 32 also has an upper boundary spaced below the upper surface of substrate 20. Counter dopant regions 30 and 32 both extend partially underneath gate conductor 24 into the original channel region of substrate 20. While only two LTA implant steps are shown, it may be necessary to perform four separate implants to permit the formation of transistors configured orthogonal to one another. Two LTA implants may be required to form counter dopant regions for one set of transistors while another pair of RTA implants may be required to form counter dopant regions for another set of transistors. As an alternative to using photoresist and implanting in a two-step manner, the LTA implant may be blanket applied while rotating the wafer. Thus, the ion implanter may be maintained in the same position as the wafer is rotated. In an alternative embodiment, the ion implanter may be rotated while the wafer remains stationary.

Figure 6A:
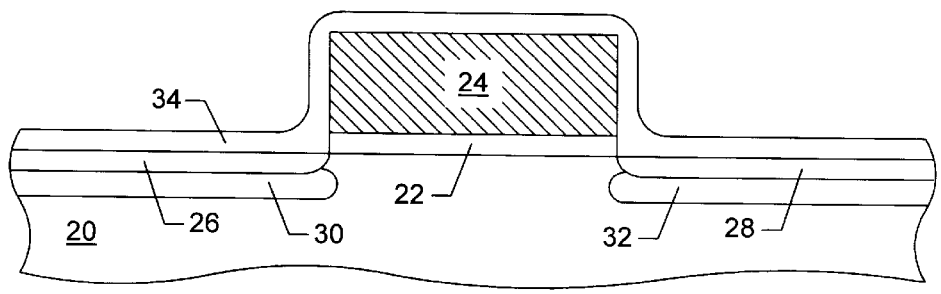
FIG. 6a depicts a partial cross-sectional view of the semiconductor topography according to one embodiment, wherein a nitride layer is deposited across the topography, subsequent to the step in FIG. 5.
Figure 6B:
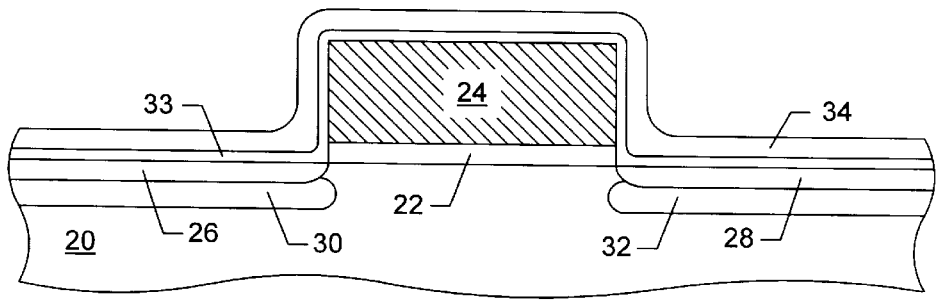
FIG. 6b depicts a partial cross-sectional view of the semiconductor topography according to another embodiment, wherein an oxide layer is deposited across the topography, followed the deposition of a nitride layer, subsequent to the step in FIG. 5.

FIGS. 6a and 6b illustrate different embodiments of a processing step to be performed subsequent to the step shown in FIG. 5. Gate dielectric 22 may be removed from LDD areas 26 and 28 prior to the steps shown in FIGS. 6a and 6b. Alternatively, those portions of gate dielectric 22 may have been removed at the same time as portions of gate conductor 24 are removed in FIG. 2. However, it is preferred to retain those portions of gate dielectric during the LDD and LTA implants to help distribute the implanted ions. Turning to FIG. 6a, a diffusion barrier layer 34 is deposited upon exposed surfaces of gate conductor 24 and substrate 20. Preferably, diffusion barrier layer 34 comprises a nitride layer that is LPCVD deposited from, e.g., a silane and ammonia bearing gas. Depositing nitride directly upon silicon might lead to the so-called effect in which NH3 reacts with silicon at the substrate surface to form nitride "ribbons". Consequently, portions of substrate 20 might be consumed, undesirably increasing the depth of the ensuing junctions. The deposition processing parameters, e.g., temperature, may, however, be controlled to avoid the Kooi effect.

Alternatively, as shown in FIG. 6b, an oxide layer 33 is CVD deposited across the topography prior to the deposition of nitride layer 34. Oxide layer 33 has a thickness of, e.g., 20 to 50 Å while nitride layer 34 has a thickness of, e.g., 50 to 100 Å Oxide layer 33 serves to reduce the mechanical stresses that normally exist between nitride and silicon. Further, the presence of oxide layer 33 between substrate 20 and nitride layer 34 helps reduce the possibility that the Kooi effect might occur. Although FIGS. 7–12 illustrate processing steps that may be performed on the topography shown in FIG. 6b, the same steps may be performed on the topography shown in FIG. 6a.

Figure 7:
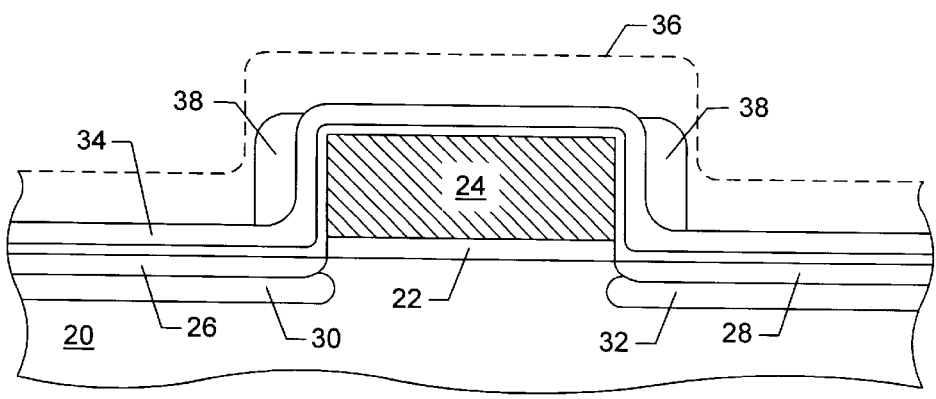
FIG. 7 depicts a partial cross-sectional view of a semiconductor topography, wherein dielectric sidewall spacers are formed upon laterally extending sidewalls of the nitride layer, subsequent to the step in FIG. 6b.
Figure 8:
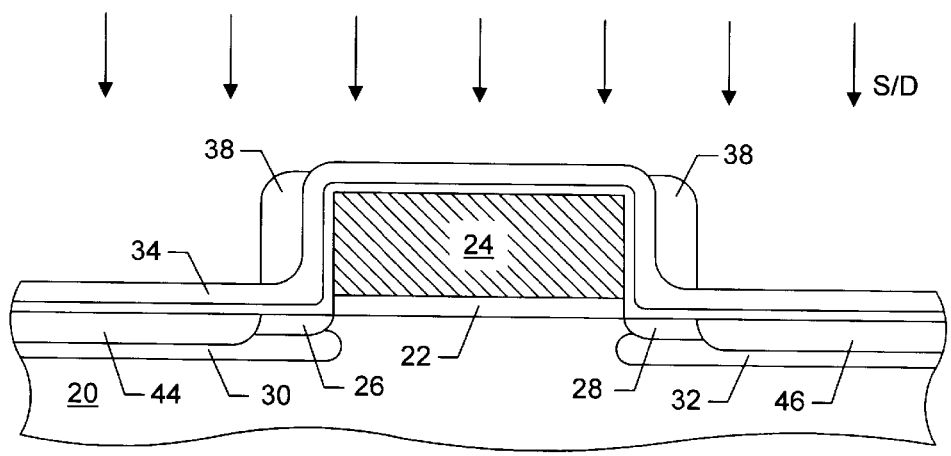
FIG. 8 depicts a partial cross-sectional view of the semiconductor topography, wherein a source/drain implant is self-aligned to the outer lateral edges of the sidewall spacers, subsequent to the step in FIG. 7.

Turning to FIG. 7, a pair of sidewall spacers 38 are formed upon laterally extending sidewalls of nitride layer 34. The formation of sidewall spacers 38 involves first depositing a dielectric material comprising, e.g., oxide, across the topography, as indicated by dotted line 36. The horizontally oriented surfaces of the dielectric material is then anisotropically etched at a faster rate than vertically oriented surfaces. As a result of the etch, the dielectric material is only retained laterally adjacent the sidewalls of nitride layer 34 in the form of sidewall spacers 38. As shown in FIG. 8, a source/drain implant ("S/D") is then performed at a higher dose and energy than the LDD implant. The S/D implant is self-aligned to the outer lateral surfaces of sidewall spacers 38. In this manner, source and drain regions 44 and 46 are formed within substrate 20 a spaced distance from gate conductor 24. The peak concentration of source and drain regions 44 and 46 is preferably spaced above the lower boundary of respective counter dopant regions 30 and 32. The dopant concentration within source and drain regions 44 and 46 is greater than that within LDD areas 24 and 28. Therefore, LDD areas 24 and 28 and source and drain regions 44 and 46 form graded junctions which increase in concentration in a lateral direction away from gate conductor 24.

Figure 9:
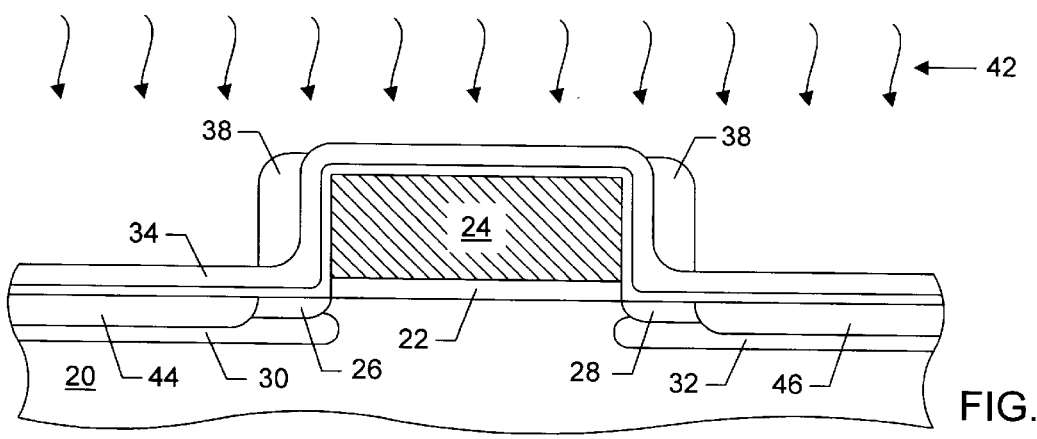
FIG. 9 depicts a partial cross-sectional view of the semiconductor topography, wherein the source and drain regions are annealed, subsequent to the step in FIG. 8.
Figure 10:
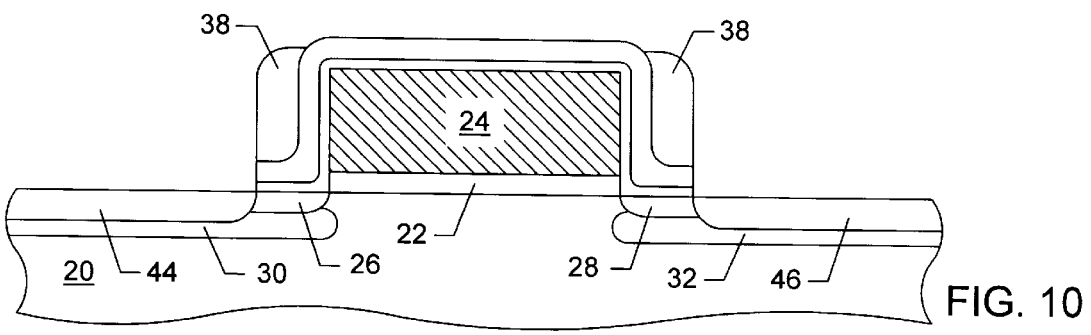
FIG. 10 depicts a partial cross-sectional view of the semiconductor topography, wherein the nitride layer and the oxide layer are removed from the source and drain regions and the upper surface of the gate conductor, subsequent to the step in FIG. 9.

Thereafter, as shown in FIG. 9, substrate 20 is exposed to radiation 42 to activate and position the as-implanted impurities. Radiation 42 may be thermal radiation supplied from an anneal furnace. Preferably, radiation 42 is radiant light supplied from e.g., an arc lamp or a tungsten-halogen lamp using a technique known as rapid thermal processing ("RTP"). The RTP may be performed for approximately 5 to 30 seconds at a temperature of 800 to 1,000° C. The presence of nitride layer 34 above LDD areas 26 inhibits dopant species from passing from the LDD areas into sidewall spacers 38 during the anneal step. Further, counter dopant regions 30 and 32 block the diffusion pathways through which the dopant species within the junctions could otherwise pass to other areas of substrate 20. Accordingly, the integration of nitride layer 34 and counter dopant regions 30 and 32 confine the dopant species to the junction areas, and thus ensure that an adequate concentration of dopant is maintained within the junctions. FIG. 10 illustrates the semiconductor topography after nitride layer 34 and oxide layer 33 have been removed from the upper surface of gate conductor 24 and from source and drain regions 44 and 46. A plasma etch may, for example, be used to remove those layers. A well-known RCA cleaning process is also preferably applied to the upper surfaces of substrate 20 and gate conductor 24 to ensure that any contaminants, such as oxide, are removed therefrom.

Figure 11:
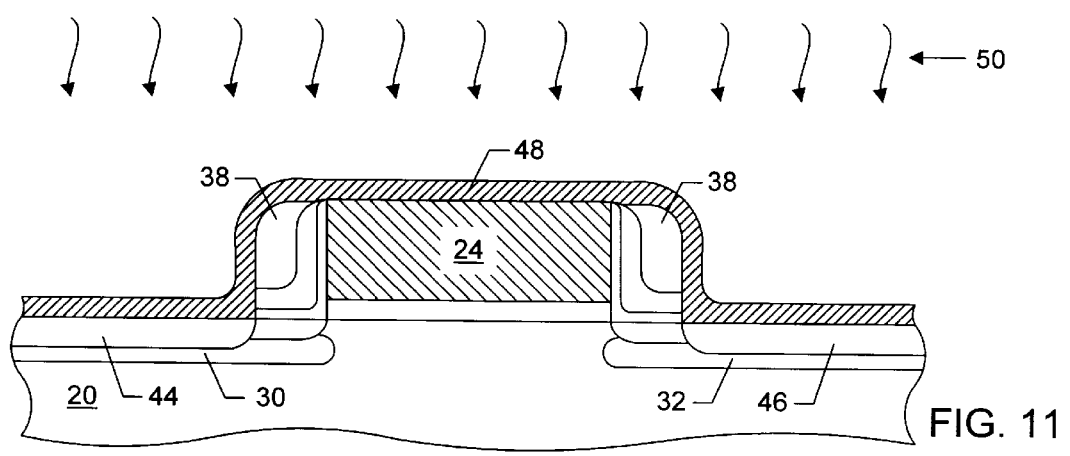
FIG. 11 depicts a partial cross-sectional view of the semiconductor topography, wherein a refractory metal is deposited across the topography and heated to promote a reaction between the metal and silicon within the substrate and the polysilicon gate conductor, subsequent to the step in FIG. 10.
Figure 12:
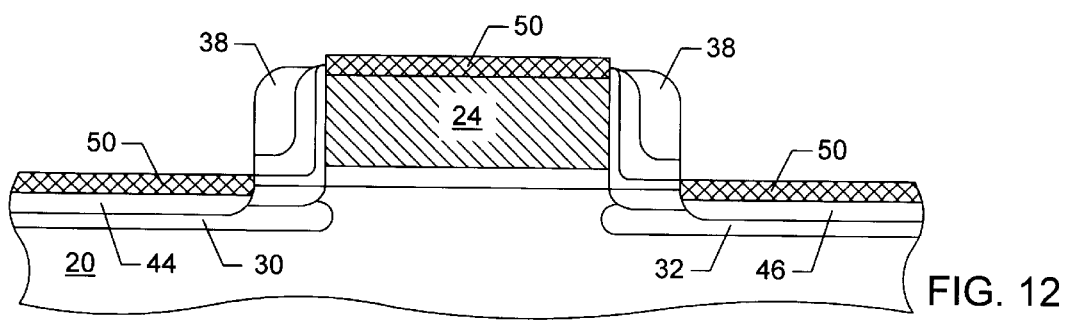
FIG. 12 depicts a partial cross-sectional view of the semiconductor topography, wherein metal silicide structures are formed upon the source and drain regions and the upper surface of the gate conductor, subsequent to the step in FIG. 11.

Turning to FIG. 11, a refractory metal 48, e.g., titanium or cobalt, may be then be formed across the semiconductor topography. Refractory metal 48 may be sputter deposited from a metal target or MOCVD ("metal organic" CVD) deposited from a source comprising a volatile metal organic compound. The topography may then subjected to a heat cycle 50 using, e.g., RTP, to cause metal atoms to react within underlying Si atoms of substrate 20 and gate conductor 24. Any unreacted refractory metal 48 may be selectively etched away. FIG. 12 depicts the resulting semiconductor topography, wherein salicide (i.e., self-aligned silicide) structures 50 have been formed upon source and drain regions 44 and 46 and upon the upper surface of gate conductor 24. In the instance that the junctions comprise p-type species and the counter dopant regions comprise n-type species, the resulting transistor is a PMOSFET transistor. It is also possible to form an NMOSFET transistor having n-type junctions and p-type dopant species. A multi-level integrated circuit which employs the transistor shown in FIG. 12 may subsequently be completed by forming alternating layers of interlevel dielectric and interconnect upon the transistor.

It will be appreciated to those skilled in the art having the benefit of this disclosure that this invention is believed to provide a method for placing a diffusion barrier layer above a transistor junction and a counter dopant region at the boundary of the transistor junction to enhance the dopant level within the junction. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming an integrated circuit, comprising:

patterning a gate conductor spaced above a semiconductor substrate upper surface;

implanting a first type of dopant at a perpendicular angle relative to the substrate surface to form a first implant region within the substrate laterally adjacent the gate conductor; and implanting a second type of dopant substantially dissimilar to the first type of dopant at a non-perpendicular angle relative to the substrate surface to form a counter dopant region beneath a lower boundary of the first implant region, wherein the counter dopant region is also formed adjacent an interior lateral boundary of the first implant region a spaced distance below the substrate surface and extends partially underneath the gate conductor.

2. The method of claim 1, wherein the first type of dopant comprises a p-type species, and wherein the second type of dopant comprises an n-type species.

3. The method of claim 2, wherein the p-type species is selected from the group consisting of $BF_2$, B, and $B_2F_{10}$, and wherein the n-type species is selected from the group consisting of As and P.

4. The method of claim 1, wherein the non-perpendicular angle relative to the upper surface of the substrate ranges from approximately 20° to 60°.

5. The method of claim 1, further comprising depositing a nitride barrier layer upon the gate conductor and the substrate surface.

6. The method of claim 5, further comprising depositing an oxide layer upon the gate conductor and the substrate surface prior to said depositing a nitride barrier layer.

7. The method of claim 5, further comprising:

forming dielectric sidewall spacers extending laterally from the nitride barrier layer arranged adjacent opposed sidewall surfaces of the gate conductor; and implanting the first type of dopant at a higher dose than the previous implanting of the first type of dopant to form a second implant region within the substrate a lateral spaced distance from the gate conductor.

8. The method of claim 7, wherein the second implant region comprises a peak concentration spaced above a base of the counter dopant region.

9. The method of claim 7, wherein the first type of dopant comprises a p-type species, and wherein the second type of dopant comprises an n-type species.

10. The method of claim 7, wherein the non-perpendicular angle relative to the upper surface of the substrate ranges from approximately 20° to 60°.

* * * * *